US006703303B2

(12) United States Patent
Chen et al.

(10) Patent No.: US 6,703,303 B2
(45) Date of Patent: Mar. 9, 2004

(54) METHOD OF MANUFACTURING A PORTION OF A MEMORY

(75) Inventors: Gary Chen, Boise, ID (US); Li Li, Meridian, ID (US); Yongjun Jeff Hu, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/405,200

(22) Filed: Apr. 1, 2003

(65) Prior Publication Data

US 2003/0194852 A1 Oct. 16, 2003

Related U.S. Application Data

(60) Continuation of application No. 10/234,577, filed on Aug. 30, 2002, which is a continuation of application No. 09/738,796, filed on Dec. 15, 2000, now Pat. No. 6,455,906, which is a division of application No. 09/385,396, filed on Aug. 30, 1999, now Pat. No. 6,358,788.

(51) Int. Cl.[7] .......................................... H01L 21/4763
(52) U.S. Cl. ....................................................... 438/627
(58) Field of Search ................................ 438/627, 643, 438/653, 655, 656, 800

(56) References Cited

U.S. PATENT DOCUMENTS

| 3,968,565 A | 7/1976 | Bertens et al. |
|---|---|---|
| 4,528,066 A | 7/1985 | Merkling, Jr. et al. |
| 4,554,050 A | 11/1985 | Minford et al. |
| 4,671,852 A | 6/1987 | Pyke |
| 4,787,958 A | 11/1988 | Lytle |
| 4,900,690 A | 2/1990 | Tamura et al. |
| 5,023,201 A | 6/1991 | Stanasolovich et al. |
| 5,100,826 A | 3/1992 | Dennison |
| 5,198,384 A | 3/1993 | Dennison |
| 5,202,287 A | 4/1993 | Joshi et al. |

(List continued on next page.)

FOREIGN PATENT DOCUMENTS

EP    0 560 324 A1    8/1998

OTHER PUBLICATIONS

US Publication No. US 2001/0003062 A1, Inventor: Rebecca Y. Tang, Pub. Date: Jun. 7, 2001, Title: Gate Sidewall Passivation to Prevent Abnormal Tungsten Polycide Growth.

US Publication No. US 2001/0019894 A1, Inventors: Peng et al., Pub Date: Sep. 6, 2001, Title: Pre–Heat Step (or Chamber) Implemented in PR Dry Ash Machines to Effectively Eliminate PR Extrusion (Bubble) After Alloy.

Silicon Processing for the VLSI Era—Vol. 1: Process Technology, Stanley Wolf and Richard N. Tauber, *Lattice Press*, Sunset Beach, California (1986), pp. 386–388.

*Primary Examiner*—Craig A. Thompson
(74) *Attorney, Agent, or Firm*—Knobbe Martens Olson & Bear LLP

(57) ABSTRACT

Metal nitride and metal oxynitride extrusions often form on metal suicides. These extrusions can cause short circuits and degrade processing yields. The present invention discloses a method of selectively removing such extrusions. In one embodiment, a novel wet etch comprising an oxidizing agent and a chelating agent selectively removes the extrusions from a wordline in a memory array. In another embodiment, the wet etch includes a base, that adjusts the pH of the etch to selectively remove certain extrusions relative to other substances in the wordline. Accordingly, new metal silicide structures can be used to form novel wordlines and other types of integrated circuits.

27 Claims, 6 Drawing Sheets

U.S. PATENT DOCUMENTS

| | | |
|---|---|---|
| 5,425,392 A | 6/1995 | Thakur et al. |
| 5,462,638 A | 10/1995 | Datta et al. |
| 5,498,293 A | 3/1996 | Ilardi et al. |
| 5,498,569 A | 3/1996 | Eastep |
| 5,654,233 A * | 8/1997 | Yu .............................. 438/643 |
| 5,712,168 A | 1/1998 | Schmidt et al. |
| 5,798,296 A | 8/1998 | Fazan et al. |
| 5,800,726 A | 9/1998 | Cotte et al. |
| 5,801,425 A | 9/1998 | Kuroi et al. |
| 5,814,560 A | 9/1998 | Cheung et al. |
| 5,830,798 A | 11/1998 | Dennison et al. |
| 5,888,894 A | 3/1999 | Kong et al. |
| 5,907,791 A | 5/1999 | Cappuzzo et al. |
| 5,960,303 A | 9/1999 | Hill |
| 5,989,354 A | 11/1999 | Dormer et al. |
| 6,010,965 A | 1/2000 | Shields |
| 6,015,505 A | 1/2000 | David et al. |
| 6,136,211 A | 10/2000 | Qian et al. |
| 6,150,214 A | 11/2000 | Kaeriyama |
| 6,184,117 B1 | 2/2001 | Lu |
| 6,187,617 B1 | 2/2001 | Gauthier et al. |
| 6,221,746 B1 | 4/2001 | Huang et al. |
| 6,358,788 B1 | 3/2002 | Chen et al. |
| 6,417,572 B1 | 7/2002 | Chidambarrao et al. |
| 6,455,906 B2 | 9/2002 | Chen et al. |
| 6,541,830 B1 | 4/2003 | Iyer |

* cited by examiner

METHOD OF MANUFACTURING A PORTION OF A MEMORY

This application is a continuation of U.S. application Ser. No. 10/234,577, filed on Aug. 30, 2002, which is a continuation of U.S. patent application Ser. No. 09/738,796, filed on Dec. 15, 2000, which is now U.S. Pat. No. 6,455,906, which is a divisional of U.S. patent application Ser. No. 09/385,396, filed Aug. 30, 1999, which is now U.S. Pat. No. 6,358,788, all of which are incorporated herein by reference.

BACKGROUND OF THE INVENTION

1. Field of the Invention

The invention relates generally to the removal of extrusions that form during the fabrication of integrated circuits. More particularly, the invention relates to the removal of extrusions that form on metal-oxide-semiconductor (MOS) structures.

2. Description of the Related Art

In order to improve speed and performance in semiconductor components, manufacturers typically attempt to decrease access time of various semiconductor structures located in the components by incorporating layers of materials which enhance electron flow into semiconductor structures. For example, to increase read/write speed in memory cells, such as dynamic random access memory (DRAM), semiconductor manufacturers attempt to decrease wordline access time by reducing the resistance or capacitance in a wordline. Reduction of resistance is typically achieved by layering a low-resistance conductive material over the gate in a semiconductor structure.

Some manufacturers use materials such as titanium silicide ($TiSi_x$), known for its low resistance, to form the conductive layer of a semiconductor structure. Titanium silicide, however, can become unstable during subsequent high temperature processing steps and can diffuse into the underlying gate layer (typically polysilicon), also called titanium silicide agglomeration, thereby damaging the semiconductor structure. To prevent titanium silicide agglomeration, some manufacturers cover the gate layer with a barrier layer, such as titanium nitride (TiN). Depending on the thickness of the barrier layer, however, the titanium nitride may possess a high resistance and thus detract from the low resistance effect of the conductive layer. Furthermore, during subsequent processing at high temperature and an oxygen atmosphere, titanium nitride can oxidize to form titanium oxynitride ($TiO_xN_y$).

Likewise, during subsequent processing, semiconductor structures containing metal silicide layers that may be exposed to nitrogen and oxygen rich environments at high temperature. These gases react with metal rich portions of the semiconductor structure to create metal oxynitrides. Such metal oxynitrides may expand to create extrusions which protrude outwardly from the sides of the semiconductor structure. If these extrusions contact other portions of the semiconductor, short circuits result.

To reduce the probability of short circuits resulting from extrusions, some manufacturers coat the semiconductor structure with an insulator such as a nitride spacer. While these coatings reduce the amount and extent of extrusions formed, application of such coatings is a complex and expensive process. Furthermore, these coatings may interfere with further processing steps thereby increasing manufacturing costs and decreasing semiconductor component yields.

SUMMARY OF THE INVENTION

A conductor, preferably composed of a tungsten silicide ($WSi_x$) barrier layer and a titanium silicide ($TiSi_x$) conductive layer, is disclosed for use in a semiconductor structure such as a wordline, transistor or any other structure. A novel wet etch, preferably composed of an oxidizing and chelating agent in solution, is further disclosed for selectively removing extrusions which may protrude from the conductor.

Exemplary methods of creating the conductor include sputtering tungsten silicide onto a polysilicon gate to create a tungsten silicide layer. Titanium silicide is then sputtered, onto the tungsten silicide layer. Exemplary formulations of the wet etch include a combination of an oxidizing agent such as hydrogen peroxide ($H_2O_2$) in water with a quantity of a chelating agent such as ethylenediaminetetraacetic acid (EDTA). In other embodiments, the wet etch comprises water, an oxidizing agent, a chelating agent and a base such as ammonium hydroxide. In yet other embodiments, the wet etch comprises water, an oxidizing agent, a chelating agent, a base and a buffer salt such as ammonium phosphate.

One aspect of the invention relates to a method of fabricating a wordline in a memory array. The method comprises depositing a tungsten silicide barrier layer on a wordline stack and processing the wordline stack such that tungsten nitride extrusions extend from an exposed surface of the barrier layer. The method further comprises selectively etching the tungsten nitride extrusions with a solution that comprises water, hydrogen peroxide and EDTA.

Another aspect of the invention relates to a method of fabricating a wordline in a memory array. The method comprises depositing a metal silicide layer on a wordline stack and processing the wordline stack such that metal nitride extrusions extend from the metal silicide layer. The method further comprises selectively etching the metal nitride extrusions with a solution that comprises at least an oxidizing agent and a chelating agent.

An additional aspect of the invention relates to a method of fabricating a wordline in a memory array. The method comprises depositing a tungsten silicide barrier layer on a wordline stack and depositing a titanium silicide conductive layer above the tungsten silicide barrier layer. The method further comprises processing the wordline stack such that metal nitride extrusions extend from the tungsten silicide barrier layer and the titanium silicide conductive layer. The method also comprises etching the metal nitride extrusions at a faster rate than the conductive layer or the barrier layer.

One embodiment of the invention relates to a method of fabricating a semiconductor structure. The method comprises depositing a polysilicon gate on a semiconductor substrate to form a wordline stack and depositing a conductive layer comprising metal silicide above the polysilicon gate. The method further comprises processing the wordline stack in a manner that forms protrusions on the conductive layer and etching the protrusions at a faster rate than the conductive layer.

Another embodiment of the invention relates to a method of forming a wordline gate that comprises forming metal nitride extrusions on a wordline stack and selectively removing the metal nitride extrusions. An additional embodiment relates to a method of forming a semiconductor structure. The method comprises selectively removing metal oxynitride extrusions from a semiconductor structure in a manner that does not substantially damage a conductive layer in the semiconductor structure.

Yet another embodiment relates to a method of removing metal oxynitride extrusion from a semiconductor structure in a manner that does not substantially damage a polysilicon layer in the semiconductor structure. A further embodiment relates to a method of forming a wordline gate. The method comprises forming metal oxynitride extrusions on a wordline stack and selectively removing the metal oxynitride extrusions.

One aspect of the invention relates to a wet etch for selectively removing tungsten nitride extrusions that comprises at least 10% by weight hydrogen peroxide and at least 0.03% by weight EDTA. Another aspect of the invention relates to a wet etch for selectively removing metal nitride extrusions that comprises at least 10% by weight an oxidizing agent, and at least 0.03% by weight a chelating agent.

One embodiment of the invention relates to a semiconductor structure that comprises a tungsten silicide layer, wherein the tungsten silicide layer has substantially etched tungsten nitride extrusions formed thereon. Another embodiment relates to a semiconductor structure that comprises a tungsten silicide layer, wherein the tungsten silicide layer has substantially etched tungsten oxynitride extrusions thereon. An additional embodiment relates to a semiconductor structure that comprises a titanium silicide layer, wherein the titanium silicide layer has substantially etched titanium nitride extrusions thereon. Yet another embodiment relates to a semiconductor structure that comprises a titanium silicide layer, wherein the titanium silicide layer has substantially etched titanium oxynitride extrusions thereon.

Another aspect of the invention relates to a semiconductor structure that comprise a barrier layer above a semiconductor substrate, the barrier layer comprising a tungsten silicide. The semiconductor structure further comprises a conductive layer above the wordline gate, the conductive layer comprising titanium silicide. The semiconductor structure also comprises a cap above the conductive layer.

For purposes of summarizing the invention, certain aspects, advantages and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

BRIEF DESCRIPTION OF THE DRAWINGS

These and other aspects, advantages, and novel features of the invention will become apparent upon reading the following detailed description and upon reference to the accompanying drawings.

DETAILED DESCRIPTION OF THE PREFERRED EMBODIMENTS

A conductor, preferably composed of a tungsten silicide ($WSi_x$) barrier layer and a titanium silicide ($TiSi_x$) conductive layer, is disclosed for use in a semiconductor structure such as a wordline, transistor or any other structure. A wet etch, preferably composed of an oxidizing and chelating agent in solution, is further disclosed for removing extrusions which may protrude from these low-resistance segments.

Figure 1:
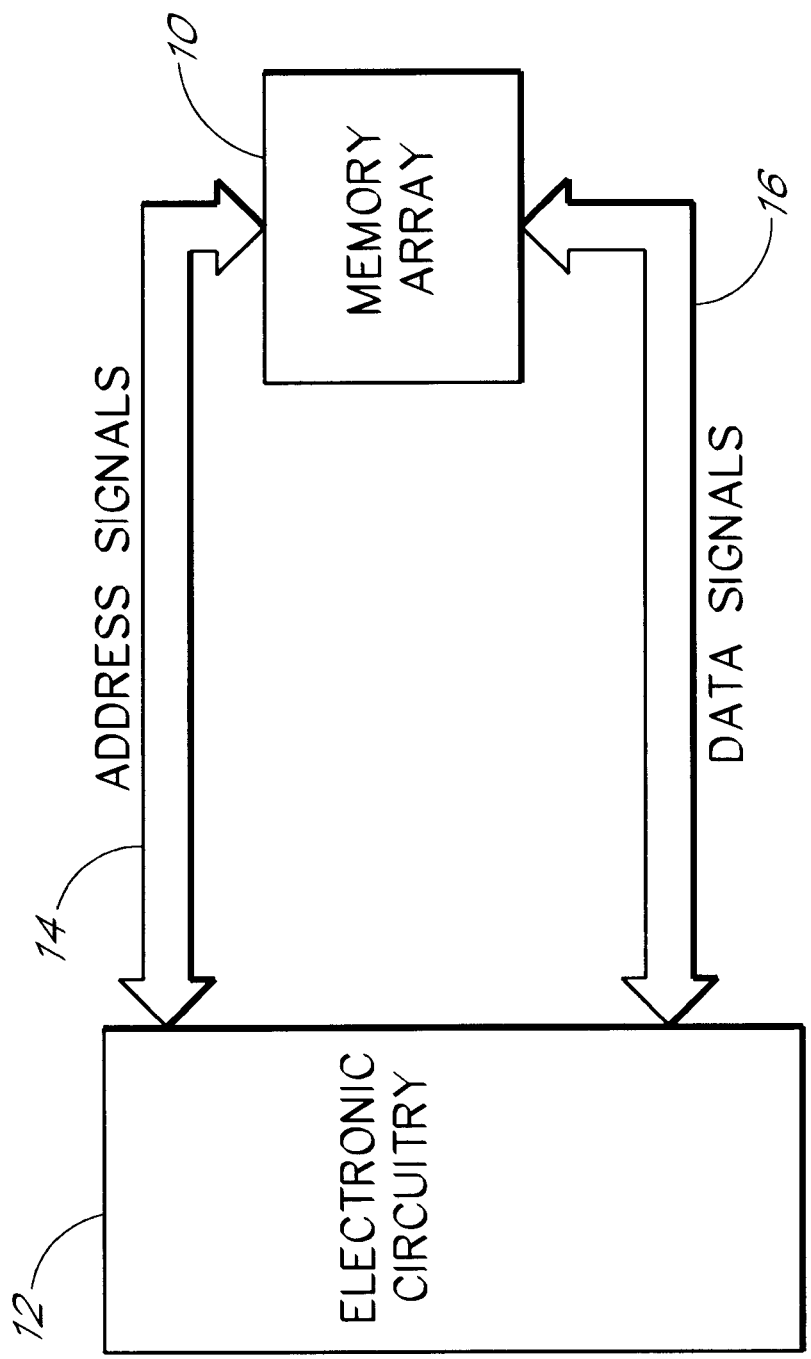
FIG. 1 is a diagram depicting communication between a microprocessor and a memory device.

As illustrated in FIG. 1, a novel memory array 10 is disclosed herein that interfaces with other electronic circuitry 12 via conventional address signals 14 and data signals 16. The address signals 14 select one or more memory cells in the memory array 10. The data signals 16, on the other hand, carry data that is stored in or retrieved from the memory array 10.

In one embodiment, the memory array 10 disclosed herein is a synchronous dynamic random access memory (SDRAM). In other embodiments the memory array 10 may comprise a wide variety of memory devices such as static memory, dynamic memory, extended data out memory or any other memory type known in the art.

The memory array 10 interfaces with different types of electronic circuitry 12. By way of example, the electronic circuitry 12 can include any device, which accesses or relies on memory including, but not limited to, processors, controllers, and the like. In some embodiments, the memory array 10 and the electronic circuitry 12 are implemented separately, in other embodiments the memory array 10 and the electronic circuitry 12 are integrated together. Furthermore, one of ordinary skill in the art will recognize that the memory array 10 can be implemented in a wide variety of devices, products and systems.

Figure 2:
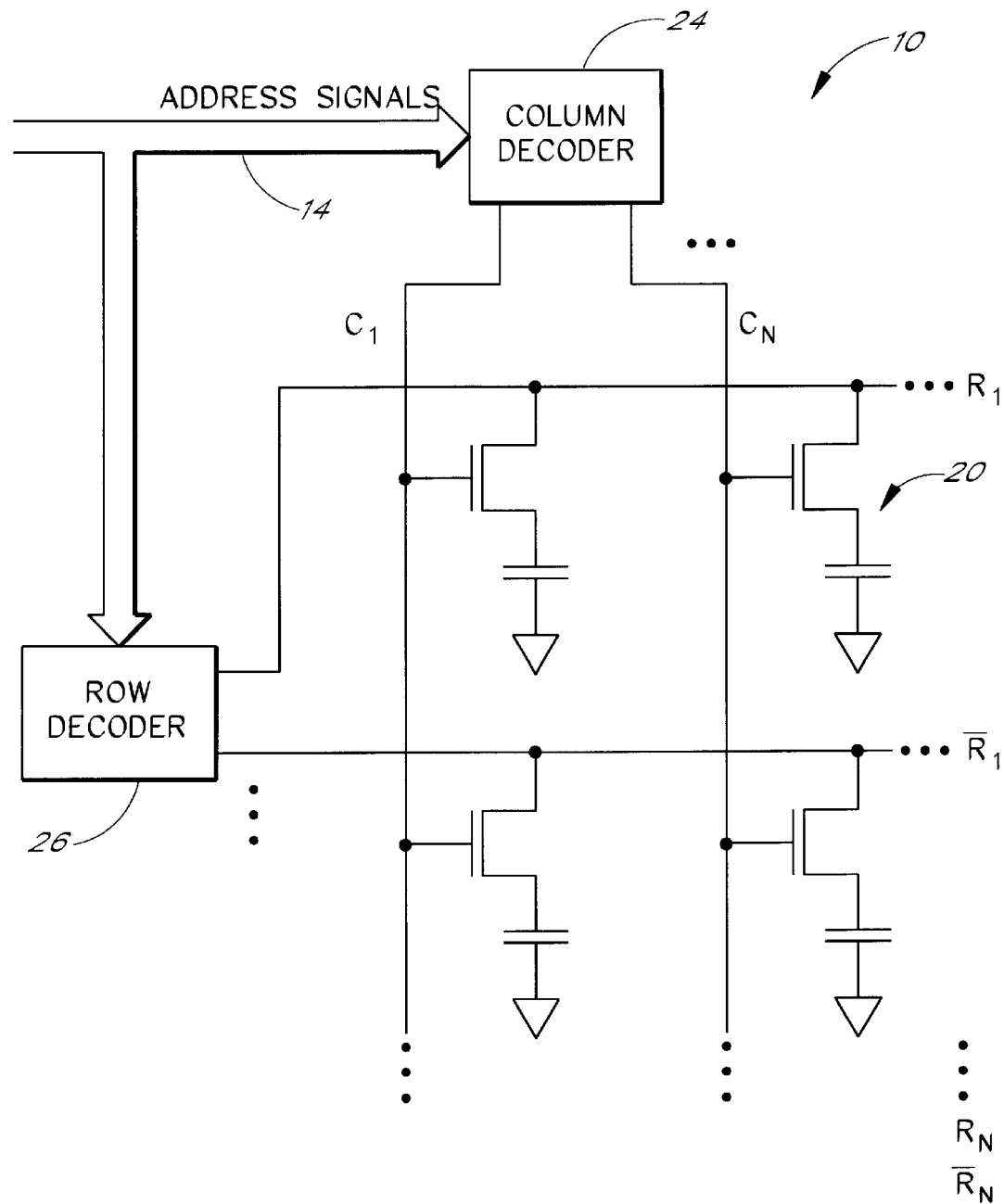
FIG. 2 shows a memory array containing multiple wordlines and bitlines.

FIG. 2 illustrates a memory array 10 that comprises a plurality of memory cells 20. These memory cells 20 are organized into columns $C_N$ and rows $R_N$. A column decoder 24 and a row decoder 26 process the address signals 14 to identify the column $C_N$ and row $R_N$ of the targeted memory cells 20. The columns are commonly known as bitlines and the rows are typically known as wordlines to those skilled in the art.

Figure 3:
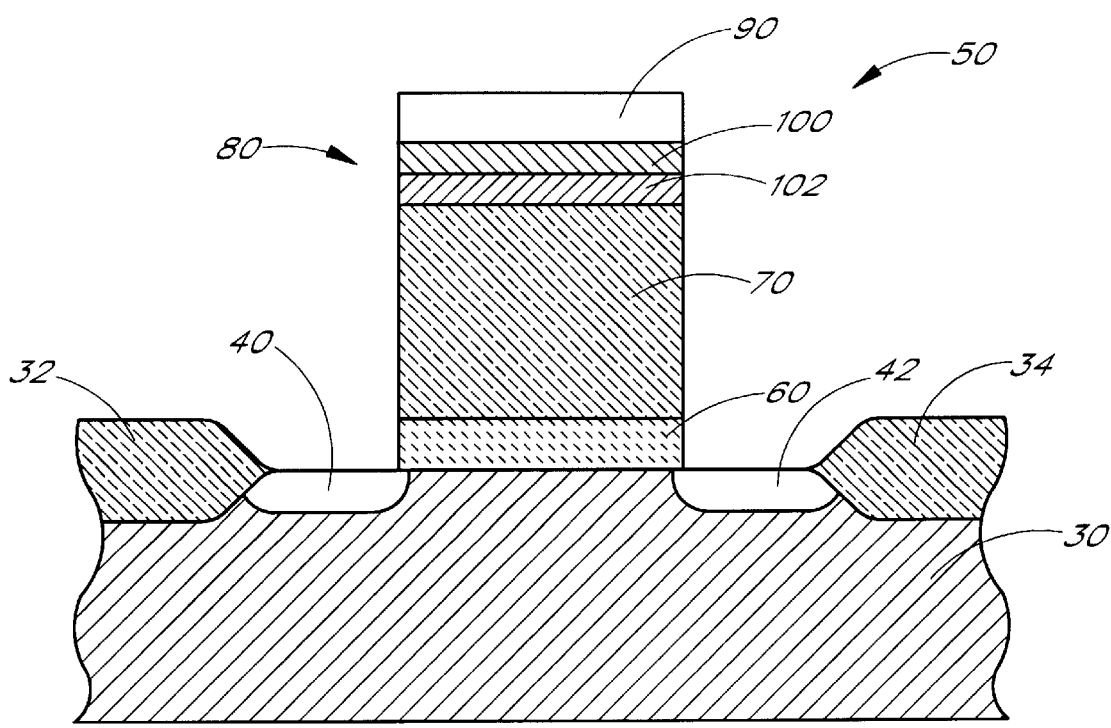
FIG. 3 is a cross-sectional view of a wordline in accordance with one embodiment of the invention.
Figure 7:
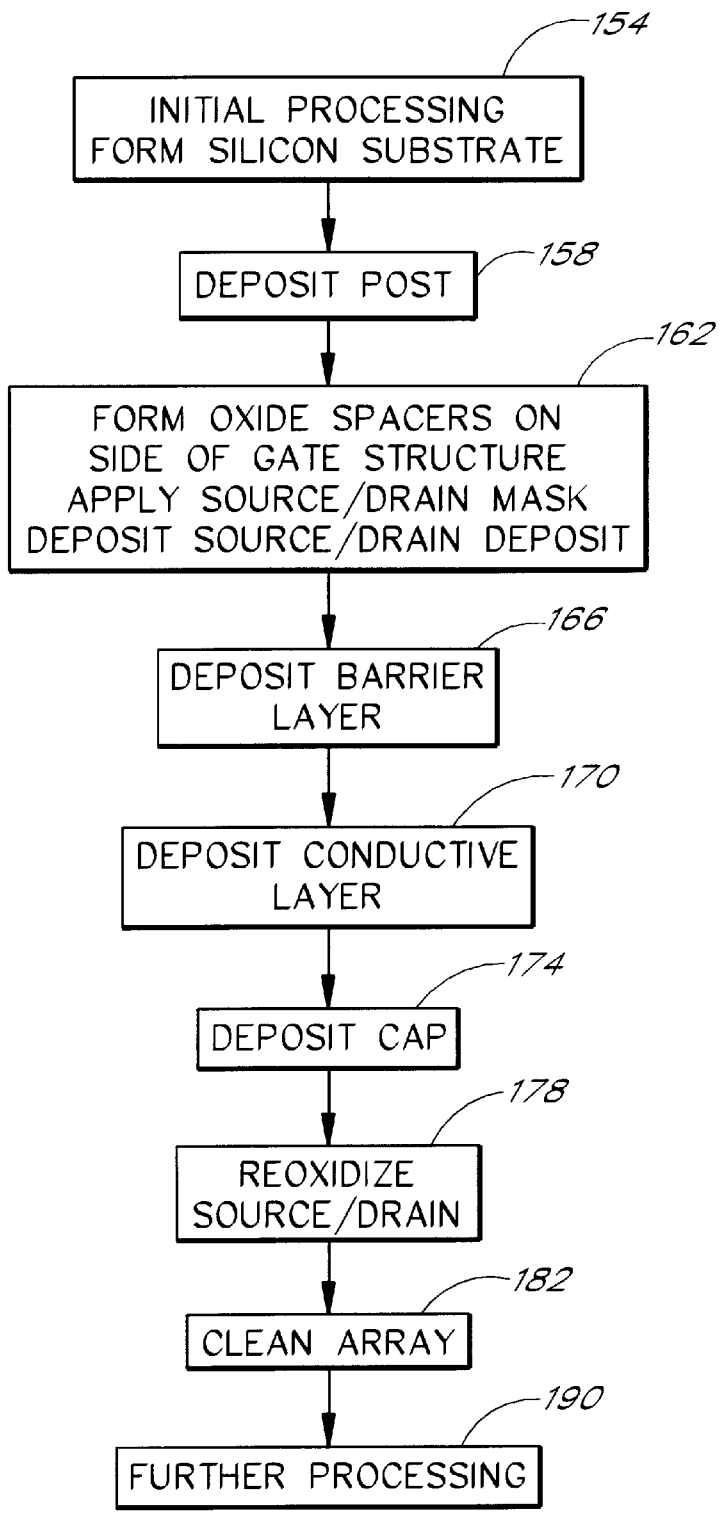
FIG. 7 is a processing flow diagram illustrating the processing blocks for one embodiment of wordline stack fabrication.

FIG. 3 illustrates a cross-sectional view of a wordline $R_N$ and FIG. 7 illustrates an associated method for making one embodiment of the wordline $R_N$. In one embodiment, a semiconductor substrate 30, formed in a processing block 154, comprises two field oxide regions, 32 and 34. The semiconductor substrate 30 may include semiconductor structures and/or other layers that have been fabricated thereon in a processing block 158 or any doped silicon platform that is commonly used in the art. While the illustrated semiconductor substrate 30 comprises an intrinsically doped monocrystalline silicon wafer, it will be understood by one of skill in the art of semiconductor fabrication that the semiconductor substrate 30 in other arrangements can comprise other forms of semiconductor layers which include active or operable portions of semiconductor devices.

The semiconductor substrate 30 is further processed in processing block 162 to create a gate comprising two n+ regions using methods common to those of skill in the art. The first n+ region 40 acts as a source and the second n+ region 42 acts as a drain. Hereinafter the first n+ region 40 will be referred to as the source 40 and the second n+ region 42 will be referred to as the drain 42. Each wordline $R_N$ further comprises a plurality of layers, which will herein be called a wordline stack 50. The layers in the wordline stack 50 comprises a dielectric layer 60, a polysilicon layer 70, a conductive segment 80 and a cap 90.

In one embodiment, the dielectric layer 60 is a gate oxide comprising silicon dioxide ($SiO_2$). The dielectric layer 60 is applied by wet or dry oxidation of the semiconductor substrate 30 followed by etching through a mask, or by other techniques common to those of skill in the art. In one embodiment, the dielectric layer 60 is approximately 60–90 angstroms (Å) thick. The polysilicon layer 70, in one embodiment, may be deposited onto the dielectric layer 60 through chemical vapor in the art. In one embodiment, the polysilicon layer 70 is approximately 1,000 Å thick.

The conductive segment 80 interconnects the source 40 and drain 42. In one embodiment, the conductive segment 80 comprises a conductive layer 100 and an optional barrier layer 102. The conductive layer 100 is typically a metal layer that forms a metal-poly gate. The conductive layer 100, when implemented over the polysilicon layer 70, lowers the overall resistivity of the wordlines $R_N$ while retaining the gate integrity provided by the polysilicon layer 70. Typically, the conductive layer 100 comprises a layer of metal silicide. One of the functions of the conductive layer 100 is to carry the charge to the memory cells 20 in communication with a wordline $R_N$.

In one embodiment, the conductive layer 100 is comprised of titanium silicide (TiSi$_x$) which is deposited in a processing block 170 by physical vapor deposition in an Argon environment. Suitable sputtering reactors are commercially available from Applied Materials of Santa Clara, Calif. In one embodiment, argon gas is introduced into the sputtering chamber at a rate of between about 50 standard cubic centimeters per minute (sccm) and 100 sccm for approximately 8 to 10 seconds. The DC magnetron power of the preferred sputtering reactor is generally set at approximately 1.0 kilowatts (kW) to approximately 2.0 kW, preferably at approximately 1.5 kW. In light of the present disclosure, however, the skilled artisan can readily determine the appropriate sputtering parameters through routine optimization to achieve the desired titanium silicide composition in a given reactor configuration.

In this embodiment the conductive layer 100 is approximately 1000 Å thick and has a resistivity of approximately 15–20 $\mu\Omega$-cm. The conductive layer 100 may also posses metal-rich pockets. For example, if the conductive layer 100 comprises titanium silicide, titanium-rich pockets may exist in the conductive layer 100.

Those of ordinary skill in the art will recognize that the conductive layer 100 may also be made from a variety of metals. Additional examples of suitable metals for forming the conductive layer 100 include, but are not limited to, copper, gold, aluminum, silicon, cobalt silicide, nickel silicide, and the like. Mixtures of metals are also suitable for forming the conductive layer 100. Exemplary methods of depositing the conductive layer 100 include, but are not limited to, Rapid Thermal Chemical Vapor Deposition (RTCVD), Low Pressure Chemical Vapor Deposition (LPCVD), and Physical Vapor Deposition (PVD).

When the memory array 10 is subjected to further processing, portions of the conductive layer 100 may diffuse into the polysilicon layer 70, thereby damaging the polysilicon layer 70. For example, if the conductive layer 100 comprises titanium silicide, the stability of the titanium silicide decreases when the semiconductor structure is exposed to temperatures exceeding 850° C. during further processing. Thus, absent a barrier layer 102, the titanium silicide tends to diffuse into the polysilicon layer 70 thereby degrading the polysilicon.

In one embodiment, the barrier layer 102 exists between the conductive layer 100 and the polysilicon layer 70. In other embodiments, the barrier layer 102 may not exist. While the barrier layer 102 electrically connects the conductive layer 100 and the polysilicon layer 70, it also inhibits diffusion of impurities between those layers and protects the polysilicon layer 70 during further processing as described below. In one embodiment, the barrier layer 102 comprises a variety of metal suicides such as tungsten silicide (WSi$_x$) which is deposited in a processing block 166 by physical vapor deposition in an argon environment.

Suitable sputtering reactors are commercially available from Applied Materials of Santa Clara, Calif. In one embodiment, argon gas is introduced into the sputtering chamber at a rate of between about 50 standard cubic centimeters per minute (sccm) and 100 sccm for approximately 5 to 10 seconds. The DC magnetron power of the preferred sputtering reactor is generally set at approximately 0.5 kilowatts (kW) to approximately 2.0 kW, preferably at approximately 1.0 kW. In one embodiment, the applied tungsten silicon is approximately WSi$_{2.7}$. In addition, the tungsten silicide remains stable up to temperatures of approximately 1050° C., thereby protecting the polysilicon layer 70 during high temperature anneals and other high-temperature processing.

In this embodiment, the barrier layer 102 is approximately 150 Å thick and has a resistivity of approximately 60 $\mu\Omega$-cm. The thinness of the barrier layer 102 combined with the low resistance of tungsten silicide improves gate access.

In light of the present disclosure, however, the skilled artisan can readily determine the appropriate sputtering parameters through routine optimization to achieve the desired barrier layer 102 composition in a given reactor configuration. Furthermore, one of ordinary skill in the art will recognize that the thickness and resistivity of the barrier layer 102 can vary over a range of values. Those of ordinary skill in the art will also recognize that the barrier layer 102 can comprise a variety of materials such as titanium nitride, silicon nitride or other materials, which protect the polysilicon layer 70.

Local variations in the uniformity of the barrier layer 102 can create metal-rich areas. These metal-rich areas may be due in part to stoichiometry variations due to the thinness of the barrier layer 102. For example, if the barrier layer 102 comprises tungsten silicide, tungsten-rich areas can exist within the tungsten silicide composition. The wordline stack 50 further comprises the cap 90, which is deposited in a processing block 174 onto the conductive segment 80 to protect the underlying materials during further processing. In one embodiment, the cap 90 comprises a layer of silicon oxide (SiO$_2$) which is deposited onto the conductive layer by chemical vapor deposition, or by other techniques common to those of skill in the art. In another embodiment, the cap 90 further comprises a layer of silicon nitride (Si$_3$N$_4$) which is deposited onto the silicon oxide layer by chemical vapor deposition, or by other techniques common to those of skill in the art. In yet another embodiment, the cap 90 comprises silicon nitride as the primary passivating layer. Those of skill in the art will recognize that the cap 90 may be made of various common insulating materials or their combination.

Figure 4:
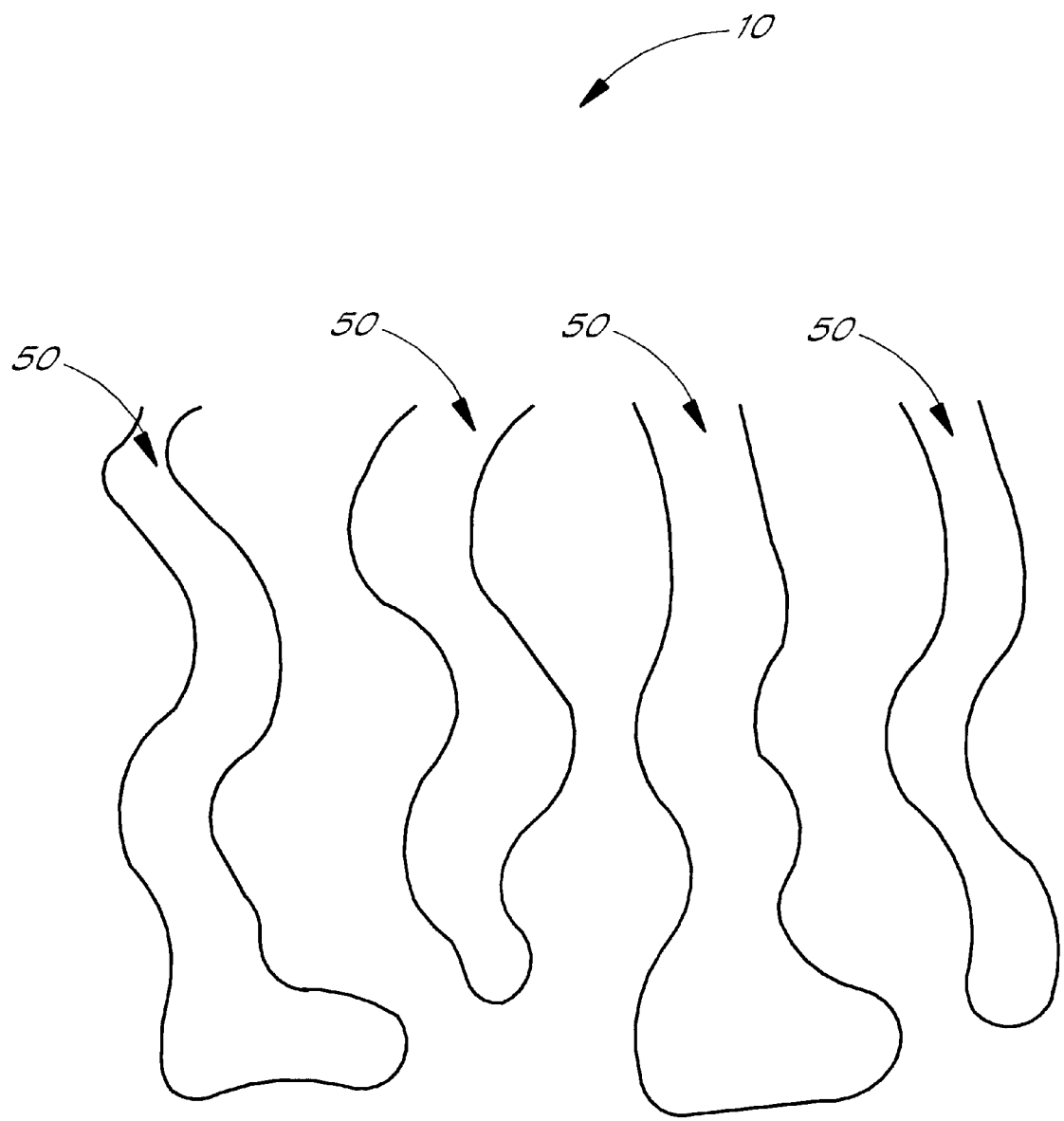
FIG. 4 shows a top view of wordline stacks in a memory array.

The wordline stack 50 is further patterned through etching. FIG. 4 illustrates a top view of several wordline stacks in one embodiment of a memory array 10. Each wordline stack 50 in this embodiment is "S" shaped. In the preferred embodiment, the etch comprises a level 50 in-situ dry etch. The etch may also comprise other dry or wet etches common to those of skill in the art. The patterning stops at the gate oxide 60 or the substrate 30, and then the source 40 and the drain 42 regions are formed. In one embodiment, the source 40 and the drain 42 are doped with n-type dopants using techniques common to those of skill in the art.

After patterning the wordline stack 50, or in other processing steps, the wordline stack 50 is often exposed to nitrogen rich environments. The nitrogen may react with metal rich pockets in the conductive segment 80. For example, in an embodiment where the barrier layer 102 comprises tungsten silicide with tungsten-rich pockets, the tungsten rich pockets may react with the nitrogen to form tungsten nitride (WN$_x$). In other embodiments, where the conductive layer 100 comprises titanium silicide with titanium-rich pockets, the titanium-rich pockets may also react with the nitrogen to form titanium nitride (TiN$_x$).

In addition, a source/drain reoxidation is applied in a processing block 178 to partly fix dry etch damage and to improve device reliability. This reoxidation subjects the memory array 10 to an oxygen rich environment. While the oxygen reoxidizes the areas existing near the source and drain, the oxygen may also combine with the tungsten nitride and titanium nitride areas existing in the conductive layer 100 and the barrier layer 102 in various embodiments. When the oxygen reacts with these layers, metal oxynitrides, such as tungsten oxynitride ($WO_xN_y$) and titanium oxynitride ($TiO_xN_y$) are formed. Still further, titanium-rich and tungsten-rich areas may combine with nitrogen and then oxygen to form titanium tungsten oxynitrides ($TiWO_xN_y$). One of ordinary skill in the art will also recognize that in other embodiments, other metals in the barrier or conductive layers can combine with oxygen to create different types of metal oxynitrides.

Figure 5:
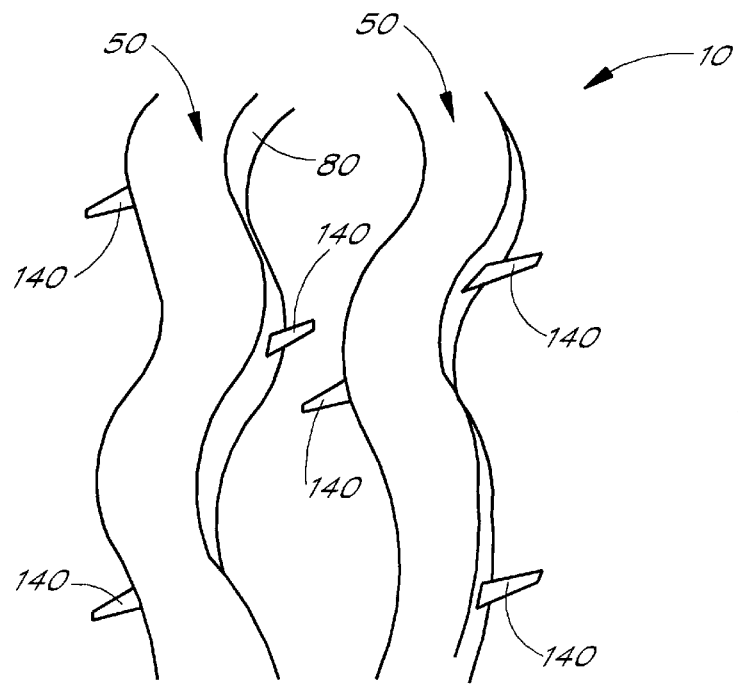
FIG. 5 is a top angled view of a wordline stack after source/drain reoxidation and before wet cleaning.

As illustrated in FIG. 5, when the metal oxynitrides form, they expand relative to the remainder of the other conductor materials. This expansion can create extrusions 140 that extend outwardly from the sides of the wordline stack 50. These extrusions 140 can contact other portions of the memory array 10, thereby creating short circuits which can alter the operation of the memory array 10 or even render the memory array 10 unusable.

For example, in one embodiment where the conductive layer 100 comprises titanium silicide and the barrier layer 102 comprises tungsten silicide, the extrusions 140 may comprise tungsten oxynitride, titanium oxynitride, and/or titanium tungsten oxynitride. These extrusions 140 not only extend outward from the exposed surface of the conductive layer 100, but also extend outward from the exposed surface of the barrier layer 102. While the dimensions of the extrusions 140 vary, the width is typically less than 10 nm and the length is approximately 30 nm to approximately 50 nm.

As explained above, these extrusions 140 can cause shorts in the memory array 10. In one example, 360 memory arrays with a titanium silicide conductive layer 100 and a tungsten silicide barrier layer 102 were constructed on a single wafer. After the wafer was processed, only 10 of the 360 memory arrays operated properly.

Although the extrusions 140 have been described with respect to the barrier layer 102 and conductive layer 100 of a wordline stack 50, it should be understood that such extrusions 140 can develop in a wide range of devices which use metal-based conductors such as transistors and the like. For example, the extrusions 140 can develop on a wide variety of metal suicides, which are then exposed to nitridizing conditions. Furthermore, the extrusions 140 can develop metal nitrides, which are exposed to oxidizing conditions.

Figure 6:
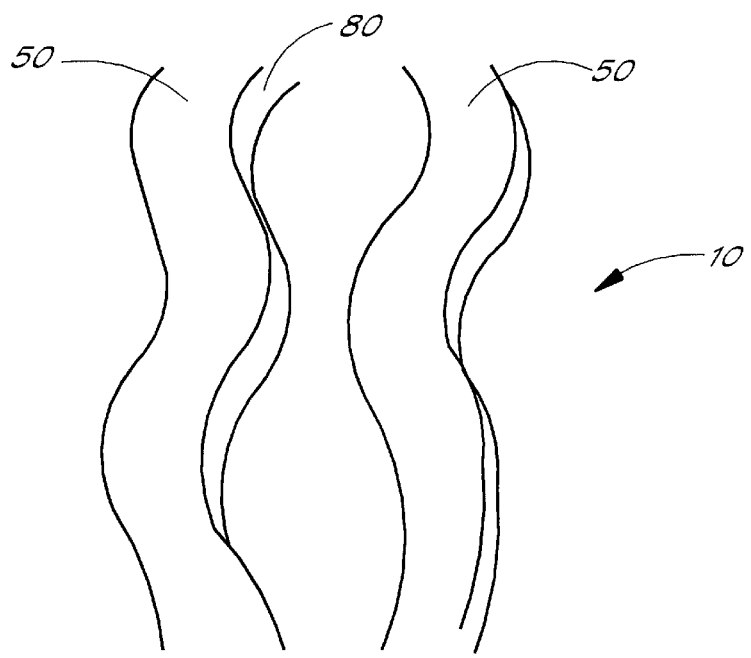
FIG. 6 is a top angled view of a wordline stack after wet cleaning.

The extrusions 140 can be removed in a processing block 182 by a unique technique which allows for selective dissolution of the extrusions 140 without significantly harming the materials of the wordline stack 50. In one embodiment, a memory array 10 is subjected to a novel wet etch that removes the extrusions 140, as illustrated in FIG. 6. The novel wet etch comprises an oxidizing agent and a chelating agent in solution.

In one embodiment, the oxidizing agent is hydrogen peroxide ($H_2O_2$). Preferably, the wet etch is approximately 10% by weight hydrogen peroxide. In other embodiments, the amount of hydrogen peroxide can vary from 2% to 50%. In further embodiments, the oxidizing agent can include any of a variety of substances including, but not limited to, ozonated water, ozone, nitric acid (HNO3), hypochlorous acid (HClO), chloric acid ($HClO_3$), ammonium persulphate (($NH_4)_2S_2O_8$), sulfuric acid ($H_2SO_4$), and the like.

In one embodiment, the chelating agent is ethylenediaminetetraacetic acid (EDTA) that is approximately 0.03% by weight EDTA. In other embodiments, the amount of EDTA in the wet etch can range from approximately less than 0.001% to more than 5% by weight EDTA. In further embodiments, the chelating agent can be any of a variety of substances including, but not limited to, ligands, the amine group, the carboxylic acid group compounds, oxalate, acetate, disodium ethylenediamine acid ($H_2NC_2H_4NH_2$), glycine ($NH_2CH_2COOH$), iminodiacetic acid ($NH(CH_2COOH)O_2$), nitrolotriacetic acid ($N(CH_2COOH)_3$), tetraammonium ethylenediaminetetraacetate, tetramethylammonium ethylenediaminetetraacetate, and the like.

In a further embodiment, the etch comprises a combination of an oxidizing and chelating agent and further comprises a base. The base may be used to adjust the pH of the etch solution to improve cleaning and selectivity. In one embodiment, the base is ammonium hydroxide ($NH_4OH$). In another embodiment, the wet etch is approximately 0.02% ammonium hydroxide, 0.042% EDTA and 10% hydrogen peroxide and has a pH of about seven to eight. In other embodiments, the amount of ammonium hydroxide can vary over a wide range such as from approximately 0.5% to approximately 30% by weight, depending on the desired pH. In further embodiments the base can be any of a variety of bases including, but not limited to, tetramethyl ammonium hydroxide (TMAH), trimethoxyamphetamine (TMA), choline hydroxide, sodium hydroxide, potassium hydroxide, and the like.

In still a further embodiment, the etch solution comprises a combination of an oxidizing agent, a chelating agent, a base and a buffer salt. The buffer salt may be added to help maintain a constant pH level and to form a protective layer on the other materials of the stack to assist selectivity. In one embodiment, the buffer salt is potassium sulfate (K2SO4) that is approximately 2% potassium sulfate. In other embodiments, the amount of potassium sulfate can vary over a wide range, depending on the pH and concentration of other substances in the wet etch solution. In further embodiments, the buffer salt can be any of a variety of salts including, but not limited to, potassium phosphate, diammonium phosphate, and the like.

In one embodiment, the wet etch is heated to 65° C. It has been found that a 65° C. wet etch comprising 10% hydrogen peroxide and 0.03% EDTA in water removes tungsten nitride at approximately 2040 Å/min. and titanium nitride at approximately 200 Å/min. This wet etch further removes tungsten oxynitride at approximately 200 Å/min. Estimates indicate that the wet etch also removes titanium oxynitride at approximately 20 Å/min. In contrast, the wet etch removes tungsten silicide, titanium silicide, and polysilicon at lower rates such as, by way of example, at approximately 1 Å/min. The rate of etching of the tungsten oxynitride, the titanium oxynitride, the tungsten silicide, the titanium silicide and the polysilicon however, can vary.

While the wet etch is heated to 65° C. in one embodiment, the temperature of the wet etch may vary over a wide range. For example, in certain embodiments, the temperature of the wet etch varies from approximately room temperature to approximately 85° C. One of ordinary skill in the art will recognize that the temperature of the wet etch can be adjusted based on the composition of the etch solution and the composition of the extrusions 140 to be dissolved.

In the preferred embodiment, ammonium hydroxide is added to adjust the pH of the wet etch. For example, 0.02% by weight of ammonium hydroxide adjusts the pH of the wet etch to approximately 7. The pH adjustment of the wet etch enhances the metal nitride removal rates without significantly damaging the remainder of the wordline stack 50.

In one embodiment, a memory array 10 is soaked in the preferred wet etch for approximately 2 minutes to remove approximately 50 nm of tungsten oxynitride extrusions 140. The length of time of cleaning can vary over a wide range. For example, in certain embodiments, the length of time of cleaning varies from approximately 5 minutes to approximately 30 minutes. Those of skill in the art will recognize that a memory array 10 can be soaked in a wet etch solution for enough time to remove as much metal nitride and/or metal oxynitride as required.

In the example where only 10 out of 360 memory arrays constructed on a wafer operated properly after processing, a second 360 memory array wafer was constructed. With the novel wet etch, 200 of the 360 memory arrays operated properly after wet etch cleaning. The memory array 10 is ready for further processing, in a processing block 190, as may be required.

While application of the wet etch has been described with respect to removal of extrusions 140 in a wordline stack 50, it should be understood that the wet etch can be applied to a wide variety of semiconductor structures wherein extrusions 140 need to be removed therefrom. Furthermore, although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

What is claimed is:

1. A method of fabricating at least a portion of a memory, the method comprising the acts of:
   depositing a tungsten silicide barrier layer on a portion of a memory;
   depositing a titanium silicide conductive layer above the tungsten silicide barrier layer;
   processing the wordline stack such that metal nitride extrusions extend from the tungsten silicide barrier layer and the titanium silicide conductive layer;
   processing the wordline stack such that metal oxynitride extrusions extend from the tungsten silicide barrier layer and the titanium silicide conductive layer; and
   etching the metal nitride extrusions and the metal oxynitride extrusions at a faster rate than the conductive layer or the barrier layer.

2. The method of claim 1 wherein the act of etching etches the metal nitride extrusions at over 2000 Å/min.

3. The method of claim 1 wherein the metal nitride extrusions comprise tungsten nitride and the act of etching etches the tungsten nitride at over 2000 Å/min.

4. The method of claim 1 wherein the act of etching etches the metal nitride extrusions at approximately 200 Å/min.

5. The method of claim 1 wherein the metal nitride extrusions comprise titanium nitride and the act of etching etches the titanium nitride at approximately 200 Å/min.

6. The method of claim 1 wherein the act of etching etches the metal oxynitride extrusions at approximately 200 Å/min.

7. The method of claim 1 wherein the metal oxynitride extrusions comprise tungsten oxynitride and the act of etching etches the tungsten oxynitride at approximately 200 Å/min.

8. The method of claim 1 wherein the act of etching etches the metal oxynitride extrusions at approximately 20 Å/min.

9. The method of claim 1 wherein the metal oxynitride extrusions comprise titanium oxynitride and the act of etching etches the titanium oxynitride at approximately 20 Å/min.

10. The method of claim 1 wherein the act of etching etches the titanium silicide conductive layer at less than 1 Å/min.

11. The method of claim 1 wherein the act of etching etches the tungsten silicide barrier layer at less than 1 Å/min.

12. The method of claim 1 wherein the memory is a SDRAM.

13. The method of claim 1 wherein the memory is a static memory.

14. The method of claim 1 wherein the memory is a dynamic memory.

15. The method of claim 1 wherein the memory is an extended data out memory.

16. A method of fabricating at least a portion of a memory, the method comprising the acts of:
    depositing polysilicon gate on a portion of a memory;
    depositing a barrier layer comprising metal silicide above the polysilicon gate;
    processing the portion of the memory in a manner that forms protrusions on the barrier layer; and
    etching the protrusions at a faster rate than the barrier layer.

17. The method of claim 16 wherein the act of etching etches the protrusions at a faster rate than the polysilicon gate.

18. The method of claim 16 wherein the act of etching etches the protrusions at over 2000 Å/min.

19. The method of claim 16 wherein the protrusions comprise tungsten nitride and the act of etching etches the tungsten nitride at over 2000 Å/min.

20. The method of claim 16 wherein the act of etching etches the protrusions at approximately 200 Å/min.

21. The method of claim 16 wherein the protrusions comprise tungsten oxynitride and the act of etching etches the tungsten oxynitride at approximately 200 Å/min.

22. The method of claim 16 wherein the act of etching etches the metal silicide barrier layer at less than 1 Å/min.

23. The method of claim 16 wherein the metal silicide barrier layer comprises tungsten silicide and the act of etching etches the tungsten silicide barrier layer at less than 1 Å/min.

24. The method of claim 16 wherein the memory is a SDRAM.

25. The method of claim 16 wherein the memory is a static memory.

26. The method of claim 16 wherein the memory is a dynamic memory.

27. The method of claim 16 wherein the memory is an extended data out memory.

* * * * *